United States Patent [19]

Fisher

[11] 4,167,554
[45] Sep. 11, 1979

[54] CRYSTALLIZATION APPARATUS HAVING FLOATING DIE MEMBER WITH TAPERED APERTURE

[75] Inventor: Colin Fisher, Royston, England

[73] Assignee: Metals Research Limited, Herts, England

[21] Appl. No.: 800,866

[22] Filed: May 26, 1977

Related U.S. Application Data

[62] Division of Ser. No. 622,464, Oct. 15, 1975.

[30] Foreign Application Priority Data

Oct. 16, 1974 [GB] United Kingdom ............... 44792/74

[51] Int. Cl.² ............................................. B01J 17/18
[52] U.S. Cl. .................................. 422/246; 422/249; 156/608; 156/617 SP; 156/607
[58] Field of Search ......... 156/608, 617 SP, DIG. 98, 156/607; 23/273 SP; 422/246, 249

[56] References Cited

U.S. PATENT DOCUMENTS

| | | | |
|---|---|---|---|
| 2,876,147 | 3/1959 | Kniepkamp | 156/608 |
| 3,002,824 | 10/1961 | Francois | 156/608 |
| 3,078,151 | 2/1963 | Kappelmeyer | 156/608 |
| 3,249,404 | 5/1966 | Bennett | 156/608 |
| 3,265,469 | 8/1966 | Hall | 156/608 |
| 3,401,023 | 9/1968 | Mullin | 156/607 |
| 3,511,609 | 5/1970 | Kato | 156/DIG. 98 |

FOREIGN PATENT DOCUMENTS

| | | | |
|---|---|---|---|
| 1286510 | 9/1969 | Fed. Rep. of Germany | 156/608 |
| 2554354 | 10/1976 | Fed. Rep. of Germany | 156/608 |
| 996008 | 6/1965 | United Kingdom | 156/608 |

OTHER PUBLICATIONS

Tsivinskii, Soviet Physics–Solid State, vol. 7, #1, Jul. 1965, pp. 148–152.
Stepanov, Physico-Tech. Insti, ANSSSR, Leningrad, 1941, pp. 339–348.
Slvets, Electrochem. Tech., Jul.–Aug. 1967, vol. 5, #7-8, pp. 385–389.

*Primary Examiner*—Stephen J. Emery
*Assistant Examiner*—S. J. Emery
*Attorney, Agent, or Firm*—Oblon, Fisher, Spivak, McClelland & Maier

[57] ABSTRACT

Methods of growing crystals by the Czochralski method in which a member having a central vertical passageway extending through it is floated on the melt, and the crystallization is caused to take place within this passageway. The passageway may be parallel sided or tapering from top to bottom and is such that the melt does not wet the walls of the passageway. Excellent diameter control of the grown crystal is obtainable, and since the member floats on the melt during crystallisation, its position follows changes in the level of the melt as the material is pulled from the melt. In one embodiment, the member is porous and fluid is forced through the porous wall of the passageway from a cavity within the member to form a barrier to keep the melt out of contact with the wall of the passageway. In another embodiment, a liquid encapsulant is used, which forms a coating over the whole surface of the floating member including the wall of the passageway. The floating member can be made from a number of different materials, including graphite, silicon nitride, silicon carbide, boron nitride, silica beryllia. The crystal may be rotated as pulled, in which case a centering device may be provided to maintain the axis of the passageway coincident with the axis of rotation of the crystal.

10 Claims, 9 Drawing Figures

CRYSTALLIZATION APPARATUS HAVING FLOATING DIE MEMBER WITH TAPERED APERTURE

This is a division of application Ser. No. 622,464, filed Oct. 15, 1975.

FIELD OF THE INVENTION

This invention concerns the growing of crystals, for example semiconductor crystals for use in the manufacture of electronic devices.

PRIOR ART

One of the best known methods of crystal growth is the Czochralski method, in which a melt of crystallisable material is formed in a crucible, a seed crystal is dipped into the melt to begin the crystallisation process, and then the seed crystal is lifted from the melt at a slow rate to form the required crystal, which is raised along with the seed crystal. A severe problem encountered with this method is that of controlling the cross-sectional area of the crystal. For example, it is virtually impossible to form a truly cylindrical crystal, since although circular cross-section can be produced, the diameter of the crystal varies widely as the growth proceeds, thus producing large undulations in the surface of the crystal. Reference may be made to U.S. Pat. No. 3,647,389 (Weiner) for an example of the Czochralski method.

Numerous attempts have been made in the prior art to solve the problem of control of the cross-sectional area of the crystal. In U.S. Pat. No. 3,124,489 and extrusion type of apparatus is disclosed, in which the molten material is forced upwardly, by a piston, through an aperture in a die. Very precise control of the point at which crystallisation takes place, relative to the die aperture is necessary if uniform cross-sectional area of the crystal is to be achieved, but in practice such control is almost impossible to obtain. In U.S. Pat. No. 3,265,469, the molten crystallisable material is disposed in a crucible having a lid of which a central portion is frustoconical and extends downwardly and contains a central aperture. The liquid level in the crucible is arranged so that it coincides with the level of the aperture in the frustoconical portion of the lid. Such level has to be maintained by adding more crystallisable material to the melt as the crystal which is being grown is withdrawn. This involves practical disadvantages in that the materials used are often toxic and therefore it is desirable that personnel should not have to go into proximity to the apparatus while the process is being carried on; and further, certain crystallisable materials are such that it is necessary to carry out the process under pressure, in which case it is difficult to add new material to the melt as the process proceeds. Thus, in the process of U.S. Pat. No. 3,265,469 only an extremely small crystal could be grown if extra material is not added as the process continues. It is also critical in U.S. Pat. No. 3,265,469 that the exact point at which crystallisation takes place should be maintained constant during the process, if a crystal of uniform cross-sectional area is to be obtained, but in practice such control is difficult, if not impossible, to achieve. Further proposals have been made in U.S. Pat. Nos. 3,291,650 and 3,291,574 and in an article entitled "Growth of Nondendritic Single-Crystal Ribbons of Germanium" by Don E. Swets which appeared in Electrochemical Technology Vol. 5 No. 7-8 July-August 1967, pages 385 to 389. In these proposals, a disc like member is floated on top of the melt in the crucible and contains a central aperture through which the crystallisable material passes during the formation of the crystal. As the grown crystal is withdrawn, the disc like member floats downwardly in the crucible, thus making it unnecessary to add further crystallisable material to the melt, as the process proceeds. However, the exact point of crystallisation in these proposals has been slightly above the upper extremity of the aperture requiring that the precise relationship between the point at which crystallisation occurs and the position of the aperture should be maintained constant throughout the process to obtain a crystal of constant diameter. In practice, this has proved almost impossible to achieve and thus these proposals have not in fact solved the problem of control of the cross-sectional area. A more accurate control of the cross-sectional area can be obtained with the proposals of Kappelmeyer in U.S. Pat. No. 3,078,151 and Tsivinskii and Stepanov in an article entitled "The Production of Germanium Single Crystals of Predetermined Shape" Soviet Physics—Solid State Vol. 7 No. 1 July 1963, pages 148 to 152. In these proposals, a cup-shaped member is mounted at a fixed position within the crucible such that the upper edges of the cup are above the level of the surface of the melt whereas the bottom of the cup is well below the surface of the melt. The bottom of the cup contains a central passageway which is of very small diameter, acting as a capillary, and the material of the cup is such that it is not wetted by the melt. Thus, due to capillary action it is possible with an appropriate choice of the depth of the bottom of the cup below the surface of the melt and the dimensions of the aperture to provide that the level of the melt within the aperture should be maintained below the upper extremity thereof. The crystal is then grown within the aperture and accurate control of the cross-sectional area of the crystal can be achieved despite any variations in the exact position within the aperture at which crystallisation occurs, provided that the interface at which crystallisation occurs remains constrained at all times by the aperture. However, the use of this process is severely limited since the greater the depth to which the cup is forced into the melt, the smaller the aperture must be to ensure that the surface tension forces are adequate to ensure that the liquid does not spill over the top of the aperture, and thus the smaller must be the cross-sectional area of the crystals produced. On the other hand, the shallower the depth to which the cup is forced into the melt, the lesser the volume of melt available for crystallisation. Thus the shallower the depth to which the cup is immersed, the smaller the volume of crystal which can be produced without adding material to the melt, and the greater the depth to which the cup is forced, the smaller the cross-sectional area of the resulting crystal. As a result of these limitations, these processes are not commercially viable.

The Stepanov method has been considered in an article entitled "Control of Capillary Shaping of Single Crystals During the Growth Process" by Sachkov, Tatarchenko and Levinzon, Isv. Akad. Nauk SSSR, Ser. Fiz., Vol. 37, No. 11 (1973) pp. 2289-2291 and also in the above-mentioned article by Don E. Swets. Sachkov et al proposed providing excess pressure to force the liquid crystallisable material beyond the upper extremity of the aperture, with a view to avoiding the problem that the cross-sectional shape and size of the seed crystal must be exactly equal to the cross-sectional shape and size of the required crystal, but the result of this modification is that since the point of crystallisation is now above the aperture, control of the cross-sectional area during the growth process becomes almost impossible to achieve. Although Swets acknowledges the Tsivinskii and Stepanov proposals, his method, as explained above and as he acknowledges, requires that the point of crystallisation be fixed during the growth process, this point being above the upper extremity of the aperture, in order to provide uniform cross-sectional area, but as explained this is virtually impossible to achieve with certain materials such as gallium phosphide.

THE INVENTION

The problem underlying the invention, therefore, is to provide a crystal growth process in which both accurate control of the cross-sectional area of the crystal can be achieved and in which crystals of relatively large volume can be produced without the necessity of adding fresh crystallisable material to the melt as the crystal is grown.

This problem is solved in accordance with the invention in that a member having a passageway extending vertically therethrough, at least a portion of the surface of which passageway is not wetted by the melt, is floated on the melt to produce a meniscus in the passageway and the thermal conditions in the melt are maintained so that the interface at which crystallisation occurs is constrained by the passageway during crystallisation so as to keep the meniscus datum within the passageway. Since the member is floating on the melt, it will follow changes in level as the crystallised material is pulled from the melt.

By meniscus datum is meant the level at which the position of the surface of the melt is determined not by the liquid/fluid interface tension but by the geometry of the bounding solid surface. Where the melt does not wet the bounding solid surface this will be defined by the locus of the points around the bounding surface at which the meniscus melt surface first becomes parallel to said bounding surface.

Since the interface between the melt and the crystal, at which crystallisation takes place, is in the passageway, the exact position of this interface is not critical in providing a crystal of uniform cross-sectional area. If a parallel-sided passageway is utilised, a crystal of virtually exactly uniform cross-sectional area may be produced using the method of the invention; on the other hand, where the material is such that on pulling the growing crystal will grow out to the full area of the melt surface available for crystallisation, the passageway is preferably tapered to prevent rubbing and jamming. An added advantage of employing a tapering passageway is that any variation in the position of the interface will result in a variation in the cross-sectional area of the crystal dependent upon the degree of taper, which variation can be monitored.

The method in accordance with the invention may be carried out in an enclosed environment if desired, since it is not necessary to add material to the melt during the process in order to maintain the required relationship between the melt and the floating member. If desired, the method can be carried out using a liquid encapsulant, as known per se, and may be carried out under pressure. Where an encapsulant is used, this may be such as to form a coating on the floating member which acts as a barrier between the floating member and the melt, thus making it possible to manufacture the floating member from materials which would otherwise contaminate the melt.

The crystal and/or floating member and/or crucible may be rotated when producing cylindrical crystals, as known per se. When rotation is used, centering means may be employed for the floating member to ensure that the rotational axis coincides with the centre of the aperture.

In a preferred embodiment, the floating member is in the form of a plate, preferably having a projection on its lower surface, through which projection the passageway extends, ensuring that the passageway extends far enough downwardly into the melt to permit the interface to be maintained at a position below the level of the melt not within the aperture. Hereinafter, the surface level not within the aperture will be referred to as Po.

In one example the plate is formed from boron nitride (preferably pyrolytic) and this is placed in a crucible containing a charge of gallium phosphide and boric oxide. The latter material melts at a lower temperature than the gallium phosphide and coats the plate with a glass-like film before the gallium phosphide has melted. In known manner the boric oxide additionally forms an encapsulating layer on the surface of the molten gallium phosphide and the graphite plate floats on the surface of the gallium phosphide below the boric oxide at the interface of the gallium phosphide and boric oxide. Since the boron nitride is coated by the boric oxide film, this film prevents direct contact between the boron nitride and the molten gallium phosphide. A gallium phosphide crystal can then be pulled through the central aperture in accordance with the preferred method which will hereinafter be described.

Alternatively the plate may be formed from silica, or graphite, or silicon nitride or silicon carbide.

In another example in which the material to be crystallised is silicon, the plate member is formed from Beryllia.

Where an encapsulant layer such as boric oxide is not employed, the plate material may be such that the surface of the plate is not wetted by the molten crystallisable material. Thus if copper is the crystallisable material, a graphite plate may be employed since molten copper does not wet graphite.

Where the crystallisable material can be contaminated by material forming the plate, it may be impossible to introduce into the charge a material which will melt below the melting point of the material to be crystallised and which will also form a protective film on the plate. In this event the molten crystallisable material may be prevented from making contact with the surface of the plate by introducing a fluid (either liquid or gaseous) into the growth region between the crystallising material and the plate so as to form a barrier between the plate and the molten crystallisable material.

Conveniently the plate is formed from a porous substance and a fluid (either liquid or gaseous) is introduced into the interior of the plate (which may be hollowed) via a pipe (which may be flexible). The fluid seeps through to the surface of the plate which would otherwise contact the crystallising material, and forms a protective cushion or barrier preventing direct contact therebetween.

One example comprises the pulling of a crystal of silicon from a narrow passageway in a porous plate to form a wafer thin silicon crystal, in which an inert gas such as argon is forced through the porous plate to form a protective barrier between the surface of the plate and the crystallising material.

The aperture in the plate may be in the form of a narrow slit and the crystal pulling may be performed without rotation so as to pull from the slit a thin strip of crystallised material which can be chopped to form thin wafers of the crystallised material. This is of particular application where the material which is being crystallised is a semiconductor material such as silicon which will be employed in semiconductor devices or a material used for substrate for epitaxial deposition of semiconductor components.

A problem which can arise when a plate is employed as provided by the invention, is that of twinning or other dislocation and distortion in the growing crystal when, and if, the plate is suddenly jerked back from an eccentric position to rotation about the axis of rotation of the seed crystal holder. This centering will occur as the diameter of the growing crystal approaches that of the aperture in the plate. Sudden movement can cause rapid thermal changes which cause nucleation of stray crystals.

There are two preferred solutions.

According to a first preferred solution, means is provided for centering the plate relative to the axis of rotation of the seed crystal holder.

A first arrangement for centering involves the use of a circular crucible for containing the molten charge and a circular plate which is a close slipping fit within the crucible so that it remains effectively centered but can fall as the material level falls as a crystal is pulled, and arranging that the crucible is aligned with the axis of rotation of the seed crystal holder.

It is not always convenient to employ close tolerances between the plate diameter and diameter of the crucible and where a greater clearance than will guarantee centering is required, a plurality of fingers are arranged to depend downwardly from the seed crystal holder to engage the floating plate and centre it about the axis of rotation of the seed crystal holder. As the seed crystal is lifted so the fingers will be lifted eventually clear of the plate but at that stage the crystal should be well and truly formed and be of sufficient diameter and rigidity to maintain a centering force on the rotating plate by surface tension.

According to a second preferred solution the centering of the rotating plate relative to the seed crystal holder is rendered more gentle by employing at least one universal joint coupling in the rotating drive to the seed crystal holder so that in the event of a non-axial seed-on, the growing crystal is allowed to rotate eccentrically at least to begin with until the mass thereof becomes sufficient to cause a self centering of the crystal and plate with continued growth, due to surface tension.

According to a further preferred feature of the invention, the plate includes upstanding fingers arranged in a circle which is concentric with the aperture in the plate and means is provided on the seed crystal holder to slidingly engage the upstanding fingers to constrain the plate to remain concentric with the axis of the seed crystal holder but permit relative vertical movement between the seed crystal holder and the plate.

It will be appreciated that the depth to which the plate floats will be determined by its density. Accordingly therefore means is provided for accommodating removable weight members or buoyancy members on the plate for controlling the density thereof.

The invention also includes crystallised material when grown by any of the methods hereinbefore described.

One preferred embodiment of the invention provides a method of forming a crystal comprising:

(a) forming a melt of crystallisable material;

(b) floating on said melt a member whose buoyancy and weight are such that it floats partially submerged, having a vertical passageway of which the inside surface is not wetted by the melt so that a meniscus is formed, the length of the passageway being such that a range of positions of the meniscus datum can be contained within the length thereof;

(c) causing a seeding device to be dipped into the melt in the passageway;

(d) adjusting the thermal conditions to form a solid/liquid interface at which crystallisation occurs;

(e) producing relative vertical movement between the seeding device and the melt in a direction to move them apart;

(f) maintaining the thermal conditions so as to keep the meniscus datum within the passageway, during crystallisation of the melt;

(g) permitting said member to float freely on the melt during the crystallisation process so as to follow changes in the level thereof as material is pulled from the melt.

DESCRIPTION OF THE DRAWINGS

The invention will now be described by way of example with reference to the accompanying drawings in which.

Figure 1:
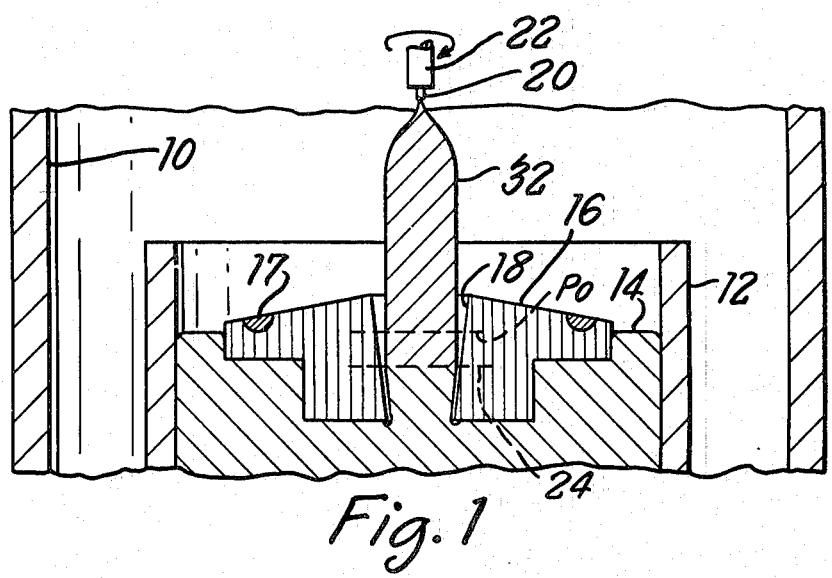
FIG. 1 is a cross-sectional view of a crucible containing a molten charge of crystallisable material and an apertured plate through which the crystalline material is grown but in which no encapsulating layer is required above the crystallising material.

For clarity all the plates shown in the drawings ae shown having a tapered central aperture. Where the cross-section of the crystallised material is smaller than that of the column of molten material from which it has been pulled, a parallel-sided aperture i.e. constant cross-section may be employed.

In FIG. 1 part of the wall of a growth chamber is shown at 10 within which is arranged a crucible, part of which is shown at 12 for containing a charge 14 of crystallisable material such as copper. Although not shown means is provided for heating the interior of the chamber 10 either by means R.F. induction heating from an external coil or by direct resistance heating through a suitable element which surrounds the crucible 12, although any convenient heating means may be employed. The charge of crystallisable material 14 is thus rendered molten and a graphite plate 16 having a central aperture 18 which tapers from the upper open end to the lower open end floats on the surface of the copper charge 14. A seed crystal 20 is held at the end of a lift and rotate mechanism the lower end only of which is shown at 22. It is to be understood that any seeding device such as a wire tip, may be employed as an alternative to using a seed. In known manner the seed crystal 20 is introduced into the molten material and on lifting and rotating, crystallisable material is drawn from the melt and by providing that the temperature gradient is such that the temperature of crystallisation of copper occurs at or just above the surface of the copper as it is drawn from the melt by the seed crystal 20, so a crystal of copper is formed on the seed crystal and a continuous crystallisation can occur as the seed is rotated and lifted so drawing more of the crystallisable material into the crystallising zone. The desired temperature gradient is obtained by adjusting the electrical (or other) input to the heating means.

A ring of copper 17 is located in an annular depression to produce correct buoyancy of the plate.

Shown in FIG. 1 is the level Po. Variation of the heat to the crystallising zone will alter the height of the crystallising interface and by appropriate adjustment the interface can be made to lie above, to coincide with or lie below the level Po.

Figure 1A:
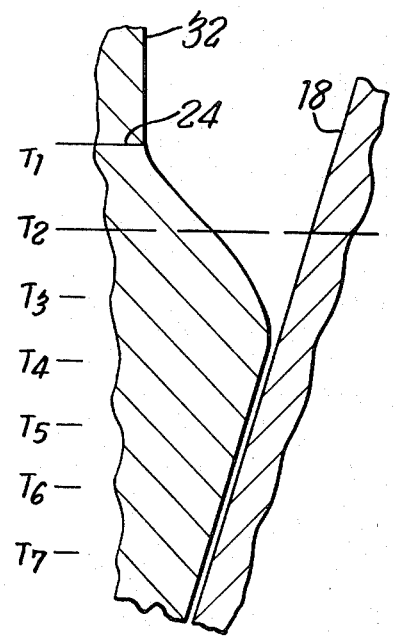
FIGS. 1(a) and 1(b) illustrate to an enlarged scale crystal growth above and below Po.
Figure 1B:
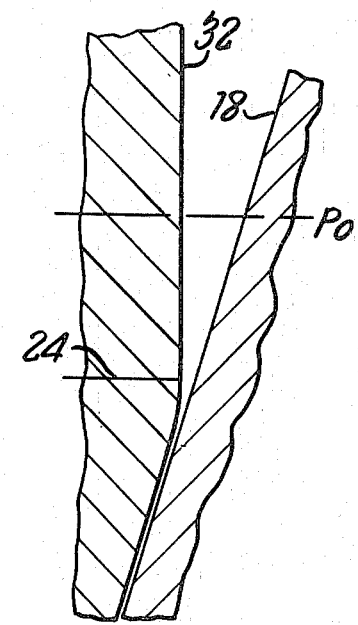

It has been found that if the crystallising interface is maintained above the level Po then variation of thermal conditions within the crystallising zone produces quite considerable increases and decreases in diameter of the growing crystal. The growth interface 24 is shown to an enlarged scale in FIGS. 1(a) and 1(b). In FIG. 1(a) the interface 24 is situated above the level Po. A number of equally spaced isotherms are shown at $T_1$, $T_2$ etc. If the level of the crystallising interface denoted by the chain dotted line 24 in FIG. 1 is maintained below the level Po, then it is found that the variation of diameter of crystal grown to thermal changes in the crystallising zone are very small and will follow the taper of the aperture 16. This can be seen by comparing the change in diameter caused by a change in temperature between $T_1$ and $T_2$ in FIG. 1(a) (where the interface is above Po) with the same change in temperature between $T_5$ and $T_6$ in FIG. 1(b) where the growth interface is below the level Po.

Therefore by forming the crystal from a point below the level Po, better control of the diameter of the growing crystal is achieved by direct control of the heat input to the apparatus than has hitherto been possible.

The success of the invention lies in keeping the interface contained by the passageway and then the gorwing crystal remains substantially constant in cross-section size. This is most effectively achieved by arranging that the interface or more accurately the meniscus datum is located approximately mid-way down a relatively long passageway so that thermal variations do not cause it to move out of the passageway and become unconstrained.

It will be appreciated that the taper of the aperture 18 shown in the drawings has been exaggerated for clarity. Although a tapering cross-section is not essential since many materials have a non-zero angle of contact with their own liquid phase, in practice a slight taper is useful to prevent rubbing and jamming and since the position of the interface in the aperture can then be monitored for example by a crystal weight measuring system.

The example quoted above illustrates an example in which a non-encapsulated crystallisable charge 14 can be pulled into a crystal without any further modifications being made.

Where the material which is to be pulled into the crystalline form does in fact wet the surface of the plate 16 the following solutions may be employed.

The first solution is to employ a different material for the plate 16. By this is included the case in which a graphite or other core is coated to a requisite depth by a non-wettable material.

Figure 2:
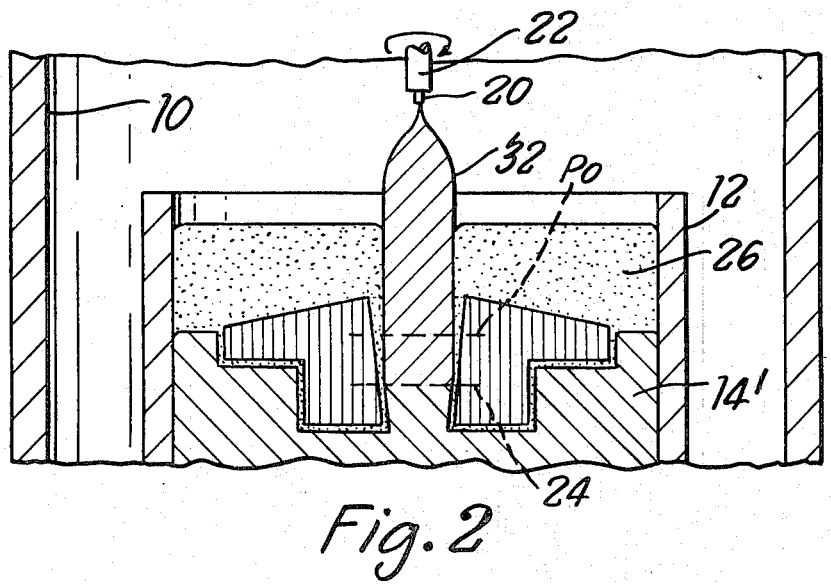
FIG. 2 is a similar cross-sectional view in which an encapsulating layer is required.

Alternatively the embodiment as illustrated in FIG. 2 may be employed. In this embodiment in which heating is applied as described with reference to FIG. 1, the charge of crystallisable material 14' has on top of it additional immiscible material having a lower melting point than the crystallisable material 14' and which when in its molten or liquid state forms a thin coating over the surface of the plate 16 which prevents contact with the graphite by the molten crystallisable charge 14'. The surplus material which coats the plate 16 forms a layer 26 which floats above the crystallisable charge 14'.

It is arranged that the relative specific gravities of the material 26, the crystallisable material 14' and the plate 16 are such that the plate 16 floats on the interface between the crystallisable material 14' and the surplus coating material 26. If densities cannot be matched, the plate can be made more buoyant or be weighted, as will be described with reference to FIG. 3(a).

Some materials can only be pulled from the melt by the Czochralski process when encapsulated under a suitable material and the invention is therefore applicable to these materials. As explained, the encapsulating material which forms the layer 25 may also serve as a suitable coating material for the plate 16.

One example of such an arrangement is in the pulling of gallium phosphide from under an encapsulating layer of boric oxide. It is found that the boric oxide forms a glass-like coating on the surface of the plate 16 which isolates molten gallium phosphide when the latter melts. The gallium phosphide can then be pulled from the aperture in the plate 16 in known manner through the encapsulating layer 26.

Whilst graphite or silica may be employed for the plate 16 when gallium phosphide and boric oxide are employed, a preferred material is silicon nitride since this latter material can be reclaimed after use to allow the same plate to be re-used.

In known manner the chamber 10 would be pressurised for the purpose of pulling a crystal of gallium phosphide.

Figure 3A:
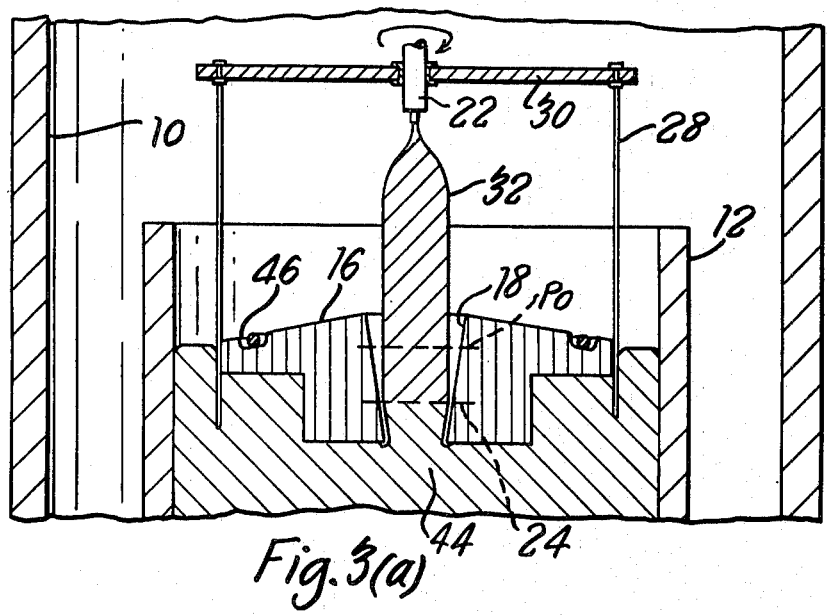
FIG. 3 is a similar cross-sectional view which illustrates modifications which may be made to the plate.

FIG. 3(a) illustrates modifications which may be made to assist in the centering of a non-circular plate 16 and for controlling its buoyancy.

To this end, pins 28 are arranged to depend from a disc or spider 30 which is attached near and is rotatable relative to the lower end of the pull rod 22 forming part of the crystal lift and rotate mechanism. The pins 28 fit around, or engage between peripheral abutments on, the plate 16 which is thus centered upon rotation relative to the pins. The spacing and position of the pins is thus chosen so that when so centered the plate is centered also on the vertical axis of rotation of the seed crystal holder and therefore the seed crystal axis of rotation. It will be appreciated that once the crystal denoted by the reference numeral 32 has grown to an appreciable size, the crystal will tend to centre the plate 16 of its own account. By allowing relative rotation between the spider 30 and the pull rod 22, the pins and spider are free to rotate with the plate at the speed of the latter rather than be constrained to rotate at the pull rod speed or rotation which is usually slower. In this way the plate is enabled to rotate at substantially the same speed as the crucible/charge throughout the growth process.

A further refinement is shown in FIG. 3(a). An annular depression 46 is formed in the upper surface of the plate 16 for receiving a ring of dense material the size of which is selected to just cause the plate to float at the required depth in the material 44. Alternatively, in the event that the relative densities of the plate and material 44 are inappropriate, the depression 46 can accommodate a buoyancy ring. Where this is required, the depression 46 may to advantage be formed on the underside of the plate so that the buoyancy ring is trapped beneath the plate.

Figure 3B:
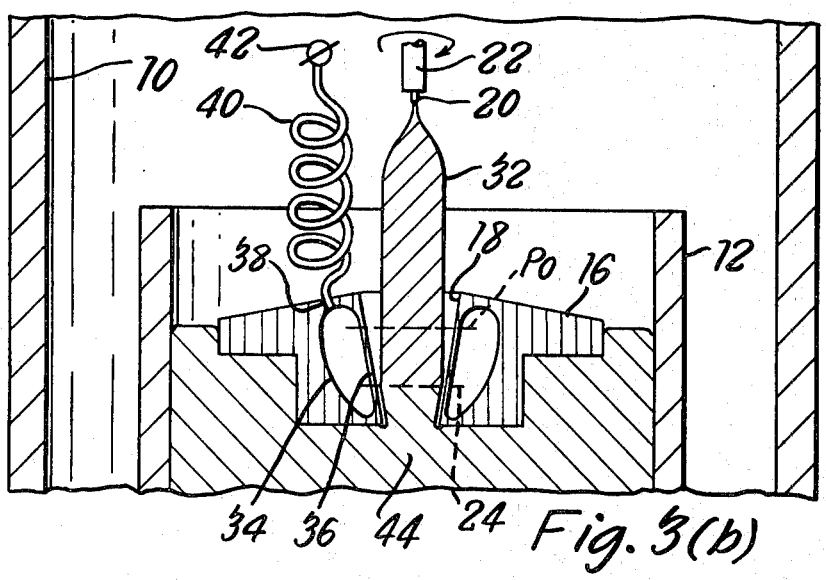

FIG. 3(b) illustrates a non-rotating crucible in which the central core of plate 16 is formed with an annular cavity 34 and at least that part of the plate forming the wall section 36 between the cavity 34 and the aperture 18 is formed from a porous material. A gas inlet passage 38 is formed in the plate and communicates with a pressurized source of gas through a flexible tube 40. A gas flow control valve 42 is shown. The tube 40 is coiled and is of sufficient length and extensibility to permit sufficient vertical movement of the plate during crystal growth.

The gas introduced under pressure into the cavity 34 seeps through the wall section 36 to appear as a gaseous film on the inside surface of the aperture 18. By appropriate choice of gas, such that no reaction occurs between it and the crystallising material 44 and by ensuring that the gas will rise in a molten material awaiting crystallisation, a gaseous cushion is formed between the forming crystal and the still molten charge of crystallisable material below the growth interface 24 which serves to separate the material 44 from that of the plate. It is believed that this arrangement will further facilitate the growth of silicon crystals for which material the preferred gas is argon.

Where it is circular the diameter of the aperture 18 will determine the mean diameter of the grown crystal and to achieve different diameters of crystal, different aperture plates 16 should be employed rather than the alternative of using a single plate 16 with a tapered bore and adjustment of the relative levels of the crystallising interface 24 and free surface level Po.

Figure 4:
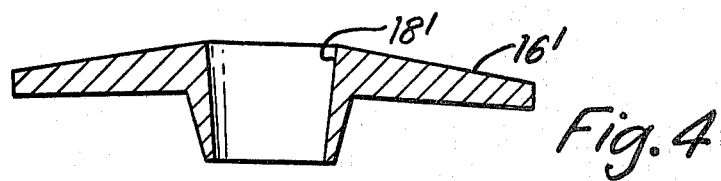
FIG. 4 is a cross-section through a modified and preferred form of plate.

By keeping the wall thickness of the downwardly depending tubular section defining the aperture 18' as thin as possible (as shown in FIG. 4) so the thermal control over the crystallising material can be improved.

Figure 5:
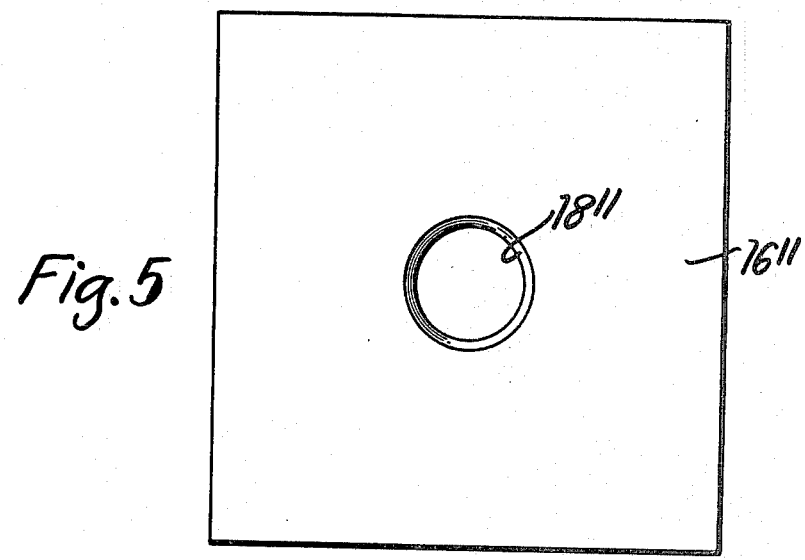
FIGS. 5 and 6 show a plan view of two preferred shapes of plate.
Figure 6:
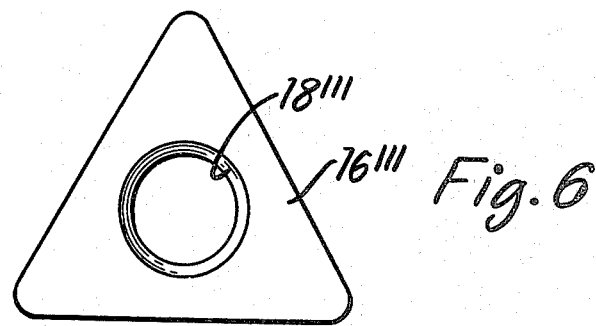

Preferred shapes (when viewed from above) of plate 16 (shown at 16" and 16''') are shown in FIGS. 5 and 6. By providing definite flat surfaces on its outer periphery so the plate is more readily centred by the fingers such as 28 shown in FIG. 3.

EXAMPLE

Growth of Single Crystals of Gallium Phosphide

Gallium phosphide crystals are normally grown by the liquid encapsulated Czochralski technique under high pressure of inert gas using liquid boric oxide to suppress the dissociation of the compound by loss of phosphorus. As is well known, diameter control in this method is extremely difficult and crystal growers using this technique are forced to accept crystals of widely varying diameters. By the use of the method described herein crystals with diameters controlled to ±1 of the desired diameter are readily obtained. In the case of gallium phosphide the preferred material for the floating plate is hot pressed silicon nitride which is of such a density (3.2 g/cm$^3$) as to float at the interface between liquid GaP and the boric oxide encapsulant. The plate is designed so that its shoulder projects 1.0 to 1.5 cm below the surface of the melt and the liquid rises up the central orifice to a height of 0.6 to 0.8 cm from its base. Note that the floating plate is completely covered by a thin film of boric oxide which is thus interposed between the GaP and the silicon nitride plate. A seed in introduced into this melt, the temperature lowered, and the crystal withdrawn until the diameter of the crystal approaches the walls of the aperture. The temperature is then lowered by a further amount such that the growth interface is about 0.5 cm below Po. With growth in this region small temperature fluctuations have little effect on crystal diameter and thus crystals of tightly controlled diameters can be grown.

A preferred angle of taper for a circular cross-section aperture for use with gallium phosphide or gallium arseride is 15 degrees.

It will be appreciated that whilst a non-wetting melt will produce a convex meniscus when stationary, the shape of the meniscus may alter slightly when the melt is rotated. For clarity the meniscus has been shown in a stationary mode in the drawings or assume the appropriate angle to it.

What is claimed is:

1. Apparatus for producing a crystal comprising a container, means for forming a melt of crystallizable material in said container, a plate member for floating on the melt in said container and having a downwardly inwardly tapering central aperture of constant slope of circular cross section wherein the inside surface of said passageway is not wetted by the melt so as to form a meniscus, a seeding device, a pulling means for producing relative movement between the seeding device and the container to allow the seeding device to be dipped into the melt and withdrawn to pull crystallized material from the melt and, means for controlling the thermal conditions within the container wherein the improvement comprises:
    (a) the buoyancy and weight of the member are such that it will float partially submerged and remain floating thus on the melt as crystallized material is pulled from the melt,
    (b) the length of the passageway is such that a range of positions of the meniscus datum can be contained within the length of the passageway,
    (c) means for rotating said seeding device and,
    (d) means for centering the central aperature of said plate member about the axis of rotation of said rotating means comprising peripheral downwardly extending abutments slidingly engaged on said plate member, and engagement means to engage said abutments which engagement means is attached to and relatively rotatable with respect to said means for rotating said seeding device.

2. Apparatus as claimed in claim 1, further comprising means for introducing a fluid to form a protective film over the surface of the passageway.

3. Apparatus as claimed in claim 1, further comprising a universal joint coupling in the drive means for rotating the seeding device so that the said member can become centered on the axis of rotation of the rotating means as the crystal grows to substantially occupy the cross-section of the passageway.

4. Apparatus as claimed in claim 3, in which the centering means comprises a plurality of fingers which depend downwardly from the seed device to circumscribe the plate member and center it.

5. Apparatus as claimed in claim 1 including a weight adapted to be removably fitted to the plate member.

6. Apparatus according to claim 1, including buoyancy compensating means adapted to be removably fitted to the plate member.

7. The apparatus of claim 1, wherein said plate member is triangular in shape.

8. The apparatus of claim 1, wherein said plate member is rectangular in shape.

9. Apparatus for producing a crystal comprising a container, means for forming a melt of crystallizable material in said container, a plate member for floating on the melt in said container and having a downwardly inwardly tapering central aperture of constant slope and circular cross section wherein the inside surface of said passageway is not wetted by the melt so as to form a meniscus, a seeding device, a pulling means for producing relative movement between the seeding device and the container to allow the seeding device to be dipped into the melt and withdrawn to pull crystallized material from the melt, and means for controlling the thermal conditions within the container wherein the improvement comprises:

(a) the buoyancy and weight of the member are such that it will float partially submerged and remain floating thus on the melt as crystallized material is pulled from the melt, (b) the length of the passageway is such that a range of positions of the meniscus datum can be contained within the length of the passageway, (c) means for rotating said seeding device and, (d) means for centering the central aperture in said plate member about the axis of rotation of said rotating means comprising upstanding fingers arranged in a circle about said central aperture in said plate member and in vertically sliding engagement with said plate member and guide means on said seed device to engage said upstanding fingers to constrain said central aperture in said plate member concentric with the axis of rotation of said seed crystal holder but permit relative rotational and vertical movement of the seed crystal holder and plate.

10. The device of claim 9 wherein said central aperture is formed of a porous material and said porous material is in fluid communication with an annular cavity disposed within said plate member; said annular cavity having a gas inlet means formed in said plate means.

* * * * *